(12) United States Patent
Chen

(10) Patent No.: US 6,815,368 B2
(45) Date of Patent: *Nov. 9, 2004

(54) SEMICONDUCTOR SUBSTRATE CLEANING

(75) Inventor: Gary Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/342,853

(22) Filed: Jan. 15, 2003

(65) Prior Publication Data
US 2003/0107074 A1 Jun. 12, 2003

Related U.S. Application Data

(62) Division of application No. 09/388,660, filed on Sep. 2, 1999, now Pat. No. 6,509,278.

(51) Int. Cl.$^7$ .............................................. H01L 21/302
(52) U.S. Cl. ....................... 438/751; 438/631; 438/645; 438/738; 438/754
(58) Field of Search ................................. 438/626, 631, 438/637, 645, 648, 672, 685, 689, 738, 742, 749–751, 754

(56) References Cited

U.S. PATENT DOCUMENTS

| | | | |
|---|---|---|---|
| 5,032,545 A | 7/1991 | Doan et al. | 437/242 |
| 5,192,703 A | 3/1993 | Lee et al. | 437/52 |
| 5,302,233 A | 4/1994 | Kim et al. | 156/636 |
| 5,376,235 A | 12/1994 | Langley | 156/664 |
| 5,645,682 A | 7/1997 | Skrovan | 156/636.1 |
| 5,783,495 A | 7/1998 | Li et al. | 438/738 |
| 5,846,336 A | 12/1998 | Skrovan | 134/10 |
| 5,849,091 A | 12/1998 | Skrovan et al. | 134/1 |
| 5,950,099 A | 9/1999 | Shoda et al. | 438/533 |
| 5,963,833 A | 10/1999 | Thakur | 438/677 |
| 5,994,220 A | 11/1999 | Gonzalez et al. | 438/672 |
| 5,994,240 A | 11/1999 | Thakur | 438/758 |
| 6,001,734 A | 12/1999 | Drynan | 438/637 |
| 6,004,401 A | 12/1999 | Staley | 134/2 |
| 6,006,765 A | 12/1999 | Skrovan et al. | 134/1.3 |
| 6,007,406 A | 12/1999 | Custer et al. | 451/36 |
| 6,030,491 A | 2/2000 | Vaartstra | 156/625.1 |
| 6,090,655 A | 7/2000 | Zahurak et al. | 438/239 |
| 6,103,455 A | 8/2000 | Huang et al. | 430/313 |
| 6,107,193 A | 8/2000 | Shiao et al. | 438/648 |
| 6,153,476 A | 11/2000 | Inaba et al. | 438/275 |
| 6,171,959 B1 | 1/2001 | Nagabushnam | 438/683 |
| 6,509,278 B1 * | 1/2003 | Chen | 438/751 |

* cited by examiner

Primary Examiner—Kevin M. Picardat
(74) Attorney, Agent, or Firm—Schwegman, Lundberg, Woessner & Kluth, P.A.

(57) ABSTRACT

Methods for removing titanium-containing layers from a substrate surface where those titanium-containing layers are formed by chemical vapor deposition (CVD) techniques. Titanium-containing layers, such as titanium or titanium nitride, formed by CVD are removed from a substrate surface using a sulfuric acid ($H_2SO_4$) solution. The $H_2SO_4$ solution permits selective and uniform removal of the titanium-containing layers without detrimentally removing surrounding materials, such as silicon oxides and tungsten. Where the titanium-containing layers are applied to the sidewalls of a hole in the substrate surface and a plug material such as tungsten is used to fill the hole, subsequent spiking of the $H_2SO_4$ solution with hydrogen peroxide ($H_2O_2$) may be used to recess the titanium-containing layers and the plug material below the substrate surface.

16 Claims, 8 Drawing Sheets

SEMICONDUCTOR SUBSTRATE CLEANING

This application is a Divisional of U.S. Application Ser. No. 09/388,660, filed Sep. 2, 1999, now U.S. Pat. No. 6,509,278 which is incorporated herein.

FIELD OF THE INVENTION

The present invention relates to semiconductor substrate cleaning or etching methods used in the fabrication of semiconductor devices. More particularly, the present invention pertains to a method for removing chemical vapor deposition (CVD) titanium and titanium nitride on a semiconductor substrate surface.

BACKGROUND OF THE INVENTION

Many electronic systems include a memory device, such as a Dynamic Random Access Memory (DRAM), to store data. A typical DRAM includes an array of memory cells. Each memory cell includes a capacitor that stores the data in the cell and a transistor that control access to the data. The capacitor typically includes two conductive plates separated by a dielectric layer. The charge stored across the capacitor is representative of a data bit and can be either a high voltage or a low voltage. Data can be stored in either the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. Thus, each such memory cell has two digit lines, a digit and digit complement.

Typically, the memory cells are arranged in an array and each cell has an address identifying its location in the array. The array includes a configuration of intersecting conductive lines and memory cells are associated with the intersections of the lines. In order to read from or write to a cell, the particular cell in question must be selected, or addressed. The address for the selected cell is represented by input signals to a word line decoder and to a digit line decoder. The word line decoder activates a word line in response to the word line address. The selected word line activates the access transistors for each of the memory cells in communication with the selected word line. The digit line decoder selects a digit line pair in response to the digit line address. For a read operation the selected word line activates the access transistors for a given word line address, and data is latched to the digit line pairs. In order for there to be memory cells there must be a semiconductor fabrication process which produces a variety of thin films.

A large variety of thin films are used in the fabrication of semiconductor devices. Chemical vapor deposition (CVD) is a widely used method for depositing such thin films for a large variety of materials. In a typical CVD process, reactant gases (often diluted in a carrier gas) enter a reaction chamber containing a deposition surface. The gas mixture may be heated by absorbing radiation as it approaches the deposition surface. Near the surface, thermal, momentum and chemical concentration boundary layers form as the gas stream heats, slows down due to viscous drag, and changes in chemical composition. Heterogenous reactions of the source gases or reactive intermediate species (formed from homogenous pyrolysis) occur at the deposition surface, thus forming the deposited material. Gaseous reaction by-products are then transported or vented out of the reaction chamber.

Another popular technique for depositing thin films is physical vapor deposition (PVD). PVD processes deposit thin films on a substrate by such techniques as sputtering, vacuum deposition, or laser ablation from a solid source or target having the desired composition of the deposited film.

Because of a fundamental difference between CVD and PVD processes, i.e., gaseous reactants versus solid sources, the resulting films tend to have different chemical characteristics even when the desired resultant film is the same, e.g., a titanium or titanium nitride film produced by CVD or PVD. These differing chemical characteristics often lead to differences in how the resultant films react to downstream processing, such as etching, or cleaning, of the substrate surface.

Cleaning of the substrate surface is often desirable after some bulk removal of material from the substrate surface. As an example, material containing one or more layers may be formed on a substrate surface to fill a hole or recess. A chemical-mechanical planarization (CMP) technique may be used to abrade the material from the surface, substantially leaving only that portion of the material contained in the hole or recess. CMP techniques must be tightly controlled to remove all of the surface material without detrimentally abrading away the substrate surface. This often results in patches or islands of the material remaining on the substrate surface. Such patches or islands are typically cleaned from the substrate surface by some chemical etchant. In the case of forming contacts, vias or interconnects in a hole or recess, removal of such islands is desirable to reduce the risk of electrical shorts.

Hydrofluoric acid (HF)-based solutions are popular chemical etchants in semiconductor processing. While such HF-based solutions are generally effective at uniform removal of titanium-containing films deposited by PVD processes, they generally result in pitting of titanium-containing films deposited by CVD processes. There is a need in the art for alternative methods for removing the CVD titanium and/or CVD titanium nitride.

SUMMARY OF THE INVENTION

The present invention addresses the above-mentioned problems in the art and other problems which will be understood by those skilled in the art upon reading and understanding the present invention. The present invention includes methods for removing a layer of titanium-containing film from a semiconductor substrate and apparatus produced using the methods.

One embodiment comprises the removal of a layer of titanium-containing film from a substrate surface. The titanium-containing film is removed from the substrate by applying a solution of $H_2SO_4$ to the substrate surface.

Another embodiment includes a method of forming a semiconductor structure. The method includes forming an insulator layer on a base layer, patterning the insulator layer to define a hole and forming at least one titanium-containing layer overlying the surface of the insulator layer and the sidewalls and bottom of the hole by chemical vapor deposition. The method further includes forming a plug layer overlying the at least one titanium-containing layer and filling the hole, removing a portion of the plug layer overlying the surface of the insulator layer and removing a portion of the at least one titanium-containing layer overlying the surface of the insulator layer by exposing the portion of the at least one titanium-containing layer to a sulfuric acid solution.

A further embodiment includes a method of forming a semiconductor structure. The method includes forming an insulator layer on a base layer, patterning the insulator layer to define a hole, forming a titanium layer overlying the surface of the insulator layer and the sidewalls and bottom of the hole by chemical vapor deposition and forming a titanium nitride layer overlying the titanium layer by chemical vapor deposition. The method further includes forming a tungsten layer overlying the titanium nitride layer and filling the hole, removing a portion of the tungsten layer overlying the surface of the insulator layer and removing a portion of the titanium and titanium nitride layers overlying the surface of the insulator layer by exposing the portion of the titanium and titanium nitride layers to a sulfuric acid solution.

The invention further includes methods of varying scope as well as apparatus produced using the methods of the various embodiments.

DESCRIPTION OF THE DRAWINGS

Figure 1A:
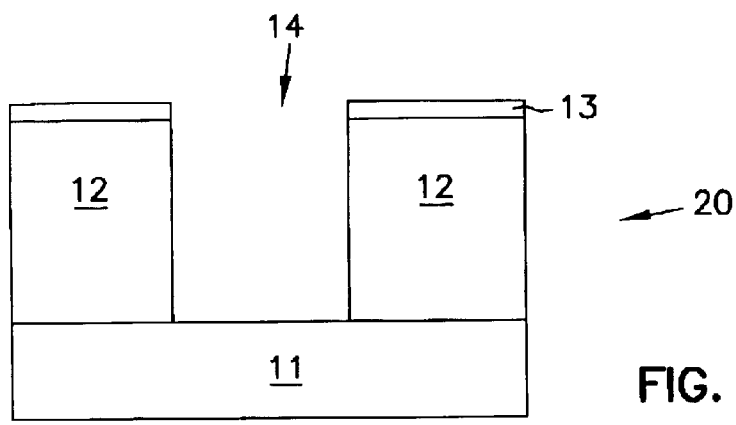
FIGS. 1A–1H are cross-sectional views of a semiconductor structure at various processing stages.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims.

The method of substrate cleaning will be illustrated in the context of the formation of a contact in a semiconductor device. It will be apparent that other semiconductor structures may be formed and utilized with the invention.

In order to manufacture a contact in a substrate 20, as illustrated in FIG. 1A, an insulator layer 12 is formed on a substrate base layer 11 and a contact hole 14 is patterned or etched through the insulator layer 12 to expose a portion of the underlying base layer 11. Insulator layer 12 may be any insulative material, but is commonly a silicon oxide material, such as silicon dioxide or borophosphosilicate glass (BPSG). Contact hole 14 has sidewalls defined by insulator layer 12 and a bottom defined by the exposed portion of base layer 11.

A dielectric anti-reflection coating (DARC) layer 13 optionally may be formed on top of the insulator layer 12 prior to patterning the contact hole 14. Such DARCs improve the resolution of photolithographic techniques utilized to pattern the contact hole 14 and such use is well understood in the art. Additionally, the bottom of contact hole 14 may be etched or cleaned by a pre-metal deposition cleaning process to improve the electrical contact to the base layer 11.

Figure 1B:
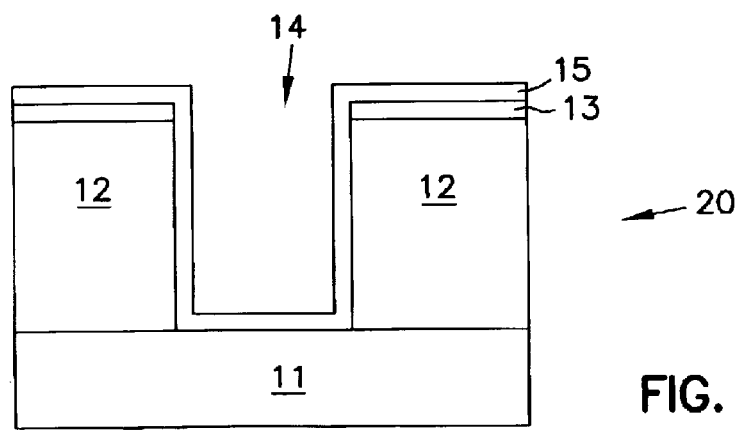

As shown in FIG. 1B, chemical vapor deposition (CVD) is then used to form a first CVD titanium-containing layer 15, such as titanium. CVD permits accurately controlled formation of films, including conformal films. CVD titanium layer 15 is formed over the surface of insulator layer 12, as well as the sidewalls and bottom of contact hole 14. A variety of gaseous reactants may be used to form CVD titanium layer 15 as is well known by persons skilled in the art.

Figure 1C:
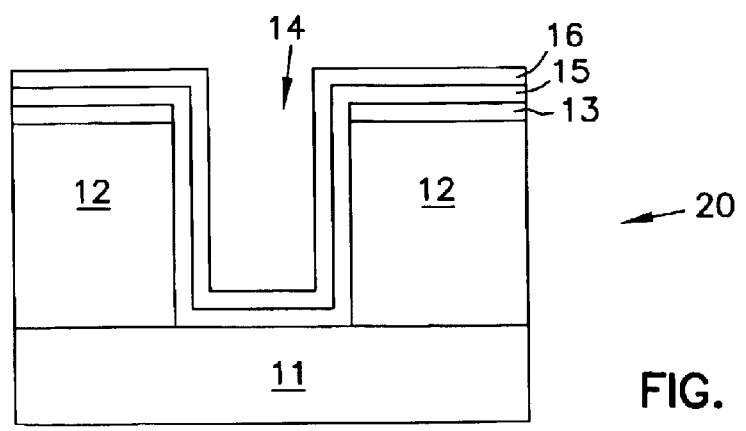

Referring to FIG. 1C, a second CVD titanium-containing layer 16, such as titanium nitride, may be formed by a second CVD process on CVD titanium layer 15. A CVD titanium nitride layer 16 is useful in improving adhesion to CVD titanium layer 15 of subsequent plug materials used for the core of the contact. As with CVD titanium layer 15, CVD titanium nitride layer 16 is formed overlying the surface of insulator layer 12, as well as the sidewalls and bottom of contact hole 14.

The substrate may be annealed to form a titanium silicide interface between CVD titanium layer 15 and the base layer 11, where the base layer 11 contains silicon. Such silicide interfaces reduce resistance between a silicon base layer 11 and CVD titanium layer 15. A rapid thermal processing (RTP) annealing process may be used to form the titanium silicide interface. The annealing process may include heating the substrate 20 to a temperature of approximately 600 to 800 degrees Celsius for approximately 10 seconds. The annealing process may be performed at any time after forming CVD titanium layer 15.

Figure 1D:
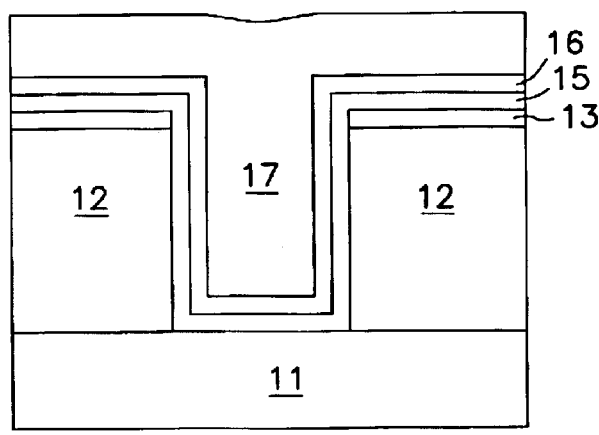
Figure 1E:
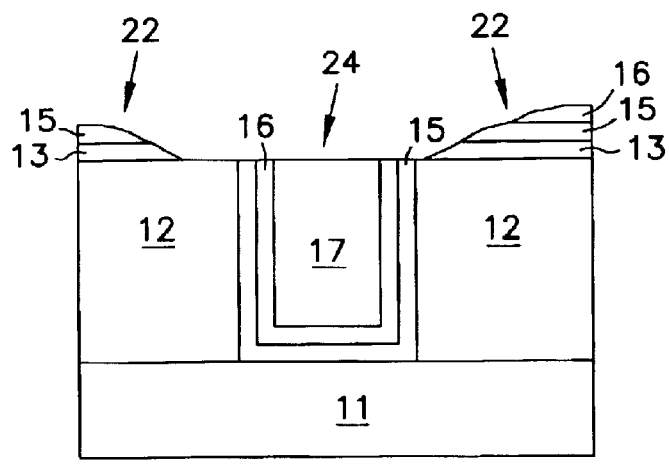

Referring to FIG. 1D, a plug layer 17, such as tungsten, is deposited on CVD titanium nitride layer 16. Plug layer 17 may contain materials other than tungsten, particularly other metals when forming a contact. However, the material of plug layer 17 must be generally resistant to sulfuric acid ($H_2SO_4$), as will become apparent below. Referring to FIG. 1E, the overriding tungsten layer 17 is removed from the top of the substrate by using a chemical mechanical planarization (CMP) process to form contact 24. CMP processing often utilizes changes in friction between an abrading surface and the surface of the material being abraded. This relative friction technique can permit use of the insulator layer 12 as a stopping layer. An alternate method of determining a stopping layer is to simply abrade for a defined period of time, having previously determined the amount of time necessary to reach the stopping layer. In either case, because of the inherent variability in industrial processing, residual material is often left behind on the stopping layer.

As shown in FIG. 1E, such residual material may take the form of islands 22 on the surface of substrate 20. Note that as FIG. 1E is not necessarily drawn to scale, the slope of islands 22 may be exaggerated. Because these islands 22 contain conductive material, i.e., CVD titanium layer 15 and CVD titanium nitride layer 16, they may result in undesirable electrical shorts if they are not removed. Such removal is addressed by the various embodiments of the invention.

In one embodiment, the substrate 20 and accompanying layers are immersed in a sulfuric acid ($H_2SO_4$) solution to remove the titanium-containing layers, i.e., CVD titanium layer 15 and CVD titanium nitride layer 16. Sulfuric acid solution, as used herein, will describe a solution consisting essentially of aqueous or anhydrous $H_2SO_4$ unless noted otherwise by subsequent spiking or additions to the solution. In a further embodiment, the substrate 20 and accompanying layers are exposed to $H_2SO_4$ vapors to remove the titanium-containing layers. In a still further embodiment, the substrate 20 and accompanying layers are sprayed with an $H_2SO_4$ solution. In one embodiment, the $H_2SO_4$ solution is heated. In another embodiment, the $H_2SO_4$ solution is heated to a temperature of approximately 100–140° C. In a further embodiment, the $H_2SO_4$ solution is heated to a temperature of approximately 120° C. In one embodiment, the $H_2SO_4$ solution is anhydrous $H_2SO_4$. In another embodiment, the $H_2SO_4$ solution is an aqueous solution containing greater than approximately 75% $H_2SO_4$. In a further embodiment, the $H_2SO_4$ solution is an aqueous solution containing greater than approximately 1% $H_2SO_4$.

Figure 1F:
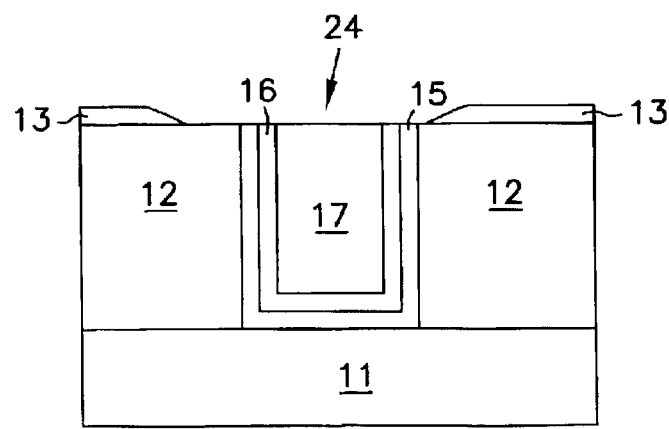

In the various embodiments, titanium-containing layers are selectively and uniformly removed from the surface of substrate 20 without detrimentally removing surrounding materials, such as tungsten layer 17 or insulator layer 12. The surface of substrate 20 includes the surface of DARC layer 13 or the surface of insulator layer 12 if no DARC layer 13 is present. FIG. 1F depicts the substrate 20 with resultant contact 24 following removal of CVD titanium layer 15 and CVD titanium nitride layer 16.

Figure 1G:
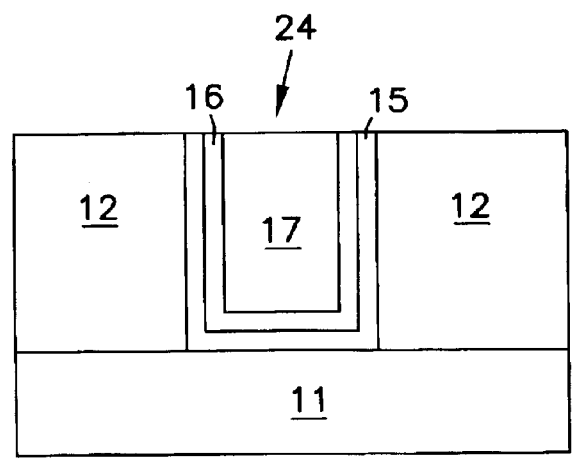

Following removal of the titanium-containing layers, islands of DARC may still remain if a DARC layer 13 was utilized in the formation of the contact 24. To remove residual DARC, a solution of tetramethylammonium fluoride (TMAF) and HF may be used. In one embodiment, the TMAF/HF solution is approximately 5–50 wt % TMAF and approximately 0.02–20 wt % HF in aqueous solution. In another embodiment, the TMAF/HF solution is approximately 22.8 wt % TMAF and approximately 0.28 wt % HF in aqueous solution. In a further embodiment, tetramethylammonium hydroxide (TMAH) replaces the TMAF. FIG. 1G depicts the substrate 20 following removal of DARC layer 13.

Figure 1H:
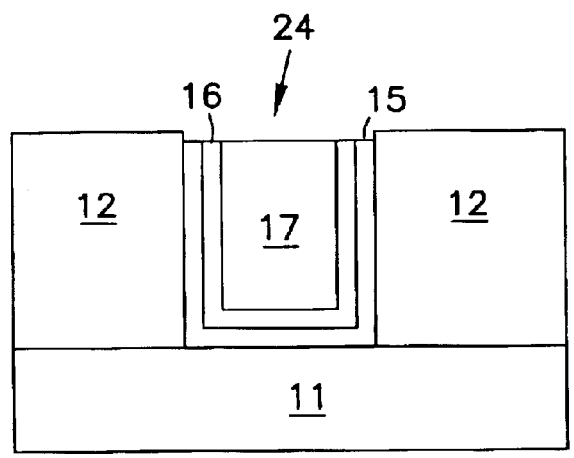

In some situations, it may be desirable to recess the materials in the contact hole 14 or otherwise condition the surface of the materials. In use with the various embodiments, the $H_2SO_4$ solution may be spiked with hydrogen peroxide ($H_2O_2$) which may selectively remove some CVD titanium layer 15 and/or CVD titanium nitride layer 16 from the contact hole 14. Spiking the $H_2SO_4$ solution with $H_2O_2$ in the present example will result in recessing of the CVD titanium layer 15, the CVD titanium nitride layer 16 and the tungsten layer 17 below the surface of the substrate 20, along with surface conditioning of tungsten layer 17. FIG. 1H depicts the substrate 20 following recessing of CVD titanium layer 15, CVD titanium nitride layer 16 and tungsten layer 17. Recessing may be accomplished by immersing the substrate 20 in the solution of $H_2SO_4$ and $H_2O_2$ for a period of about 2–120 seconds.

Those skilled in the art recognize that semiconductor structures such as contact 24 are utilized in the formation of more complex integrated circuitry. As one example, contact 24 may be used as a bit-line contact in a memory device.

Memory Devices

Figure 2:
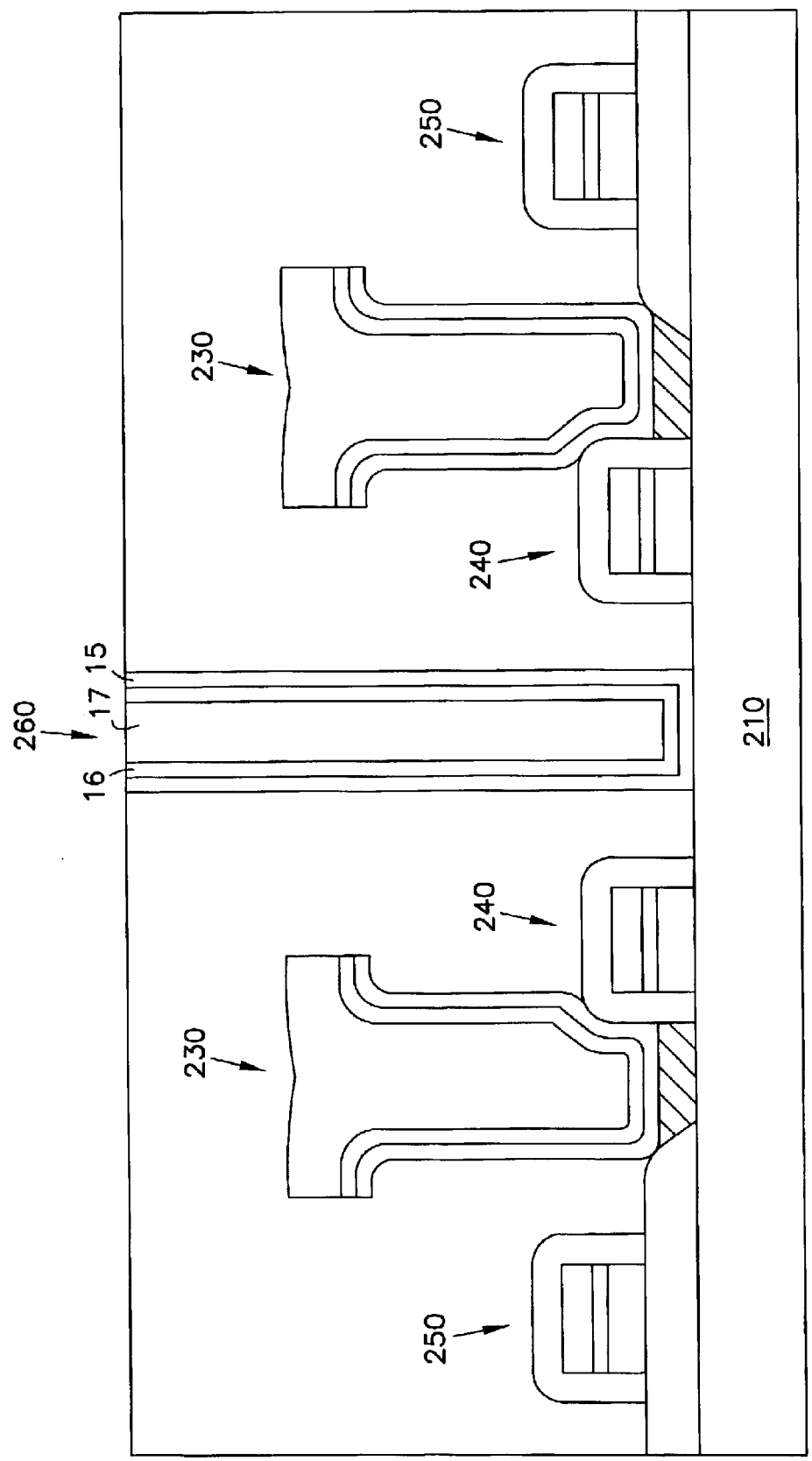
FIG. 2 is a cross-sectional view of a portion of a memory device.

FIG. 2 is a cross-sectional view of one such memory device. The memory device includes an array of memory cells. The memory cells include capacitors 230, access transistors 240, wordlines 250 and bit-line contacts 260 formed over a base layer 210, often a silicon base layer. Those skilled in the art will recognize that wordlines 250 in FIG. 2 are coupled to access transistors 240 outside the plane of FIG. 2. Bit-line contact 260 is used to couple the capacitors 230 to a bit line or digit line (not shown) of the memory device. Bit-line contact 260 may be formed in conjunction with an embodiment of substrate cleaning described above. As such, bit-line contact 260 may contain a CVD titanium layer 15, a CVD titanium nitride layer 16, and a tungsten layer 17 as previously described.

Figure 3:
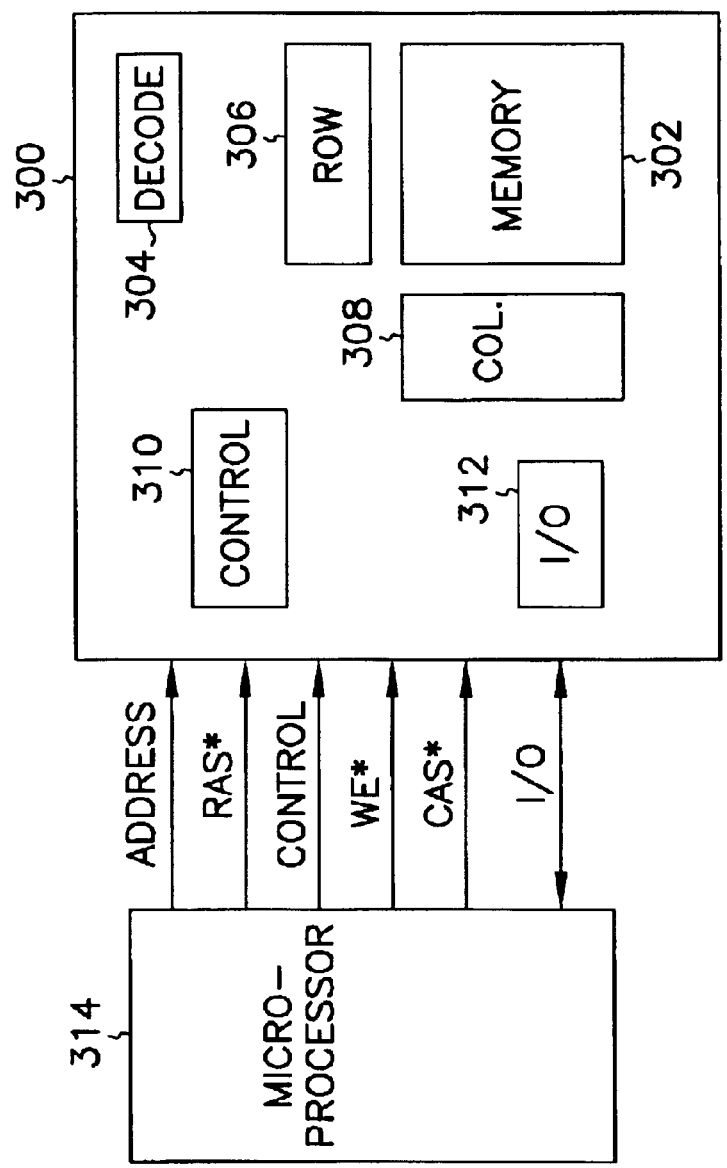
FIG. 3 is a block diagram of an integrated circuit memory device.

FIG. 3 is a simplified block diagram of a memory device according to one embodiment of the invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, RAS* and CAS* signals. The memory is used to store data which is accessed via I/O lines. It will be appreciated by those skilled in the art that additional circuitry and control signals can be provided, and that the memory device of FIG. 3 has been simplified to help focus on the invention. At least one of the memory cells has a bit-line contact formed in accordance with the invention. It will be recognized that other contacts, vias and interconnects may be used in conjunction with a portion of memory device 300 and formed in accordance with the invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 4:
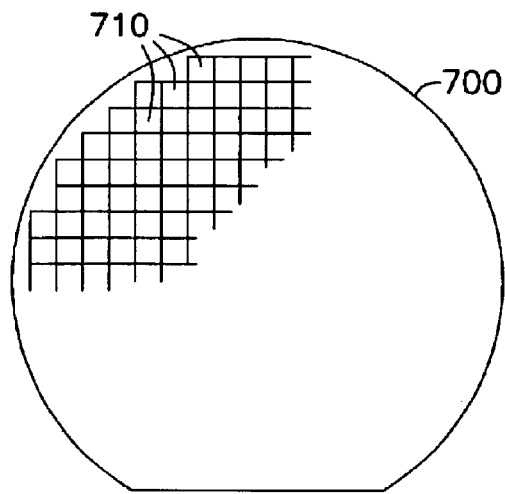
FIG. 4 is an elevation view of a wafer containing semiconductor dies.

With reference to FIG. 4, in one embodiment, a semiconductor die 710 is produced from a wafer 700. A die is an individual pattern, typically rectangular, supported by a substrate or base layer and containing circuitry, or integrated circuit devices, to perform a specific function. At least one of the integrated circuit devices has a semiconductor structure formed in accordance with the invention. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 5:
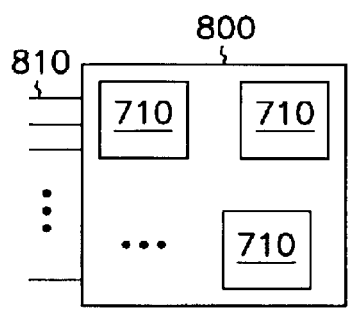
FIG. 5 is a block diagram of an exemplary circuit module.

As shown in FIG. 5, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. One or more dies 710 of circuit module 800 contain at least one semiconductor structure formed in accordance with the invention.

Some examples of a circuit module include memory modules, device drivers, power modules, communication modems, processor modules and application-specific modules, and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 6:
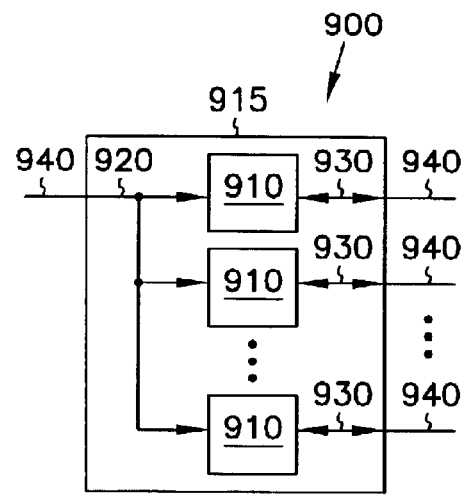
FIG. 6 is a block diagram of an exemplary memory module.

FIG. 6 shows one embodiment of a circuit module as memory module 900. Memory module 900 contains multiple memory devices 910 contained on support 915, the number depending upon the desired bus width and the desire for parity. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 6.

Electronic Systems

Figure 7:
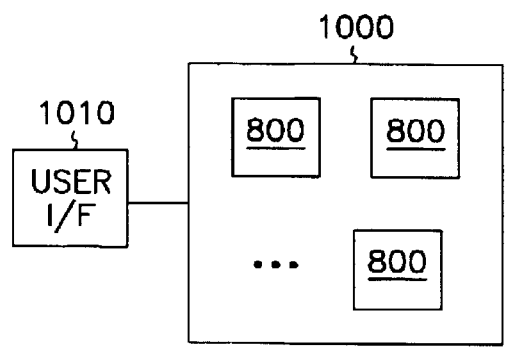
FIG. 7 is a block diagram of an exemplary electronic system.

FIG. 7 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 8:
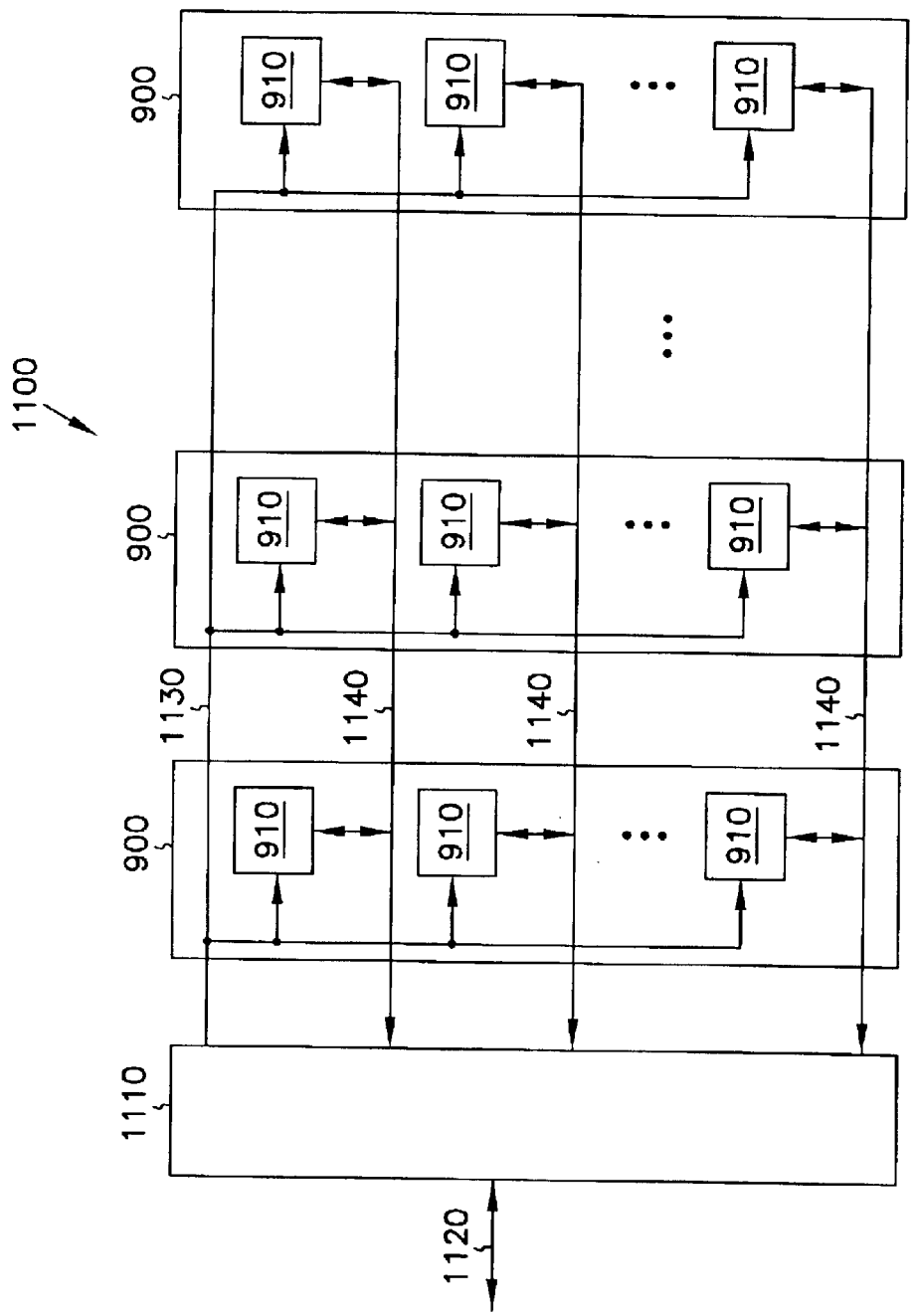
FIG. 8 is a block diagram of an exemplary memory system.

FIG. 8 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 9:
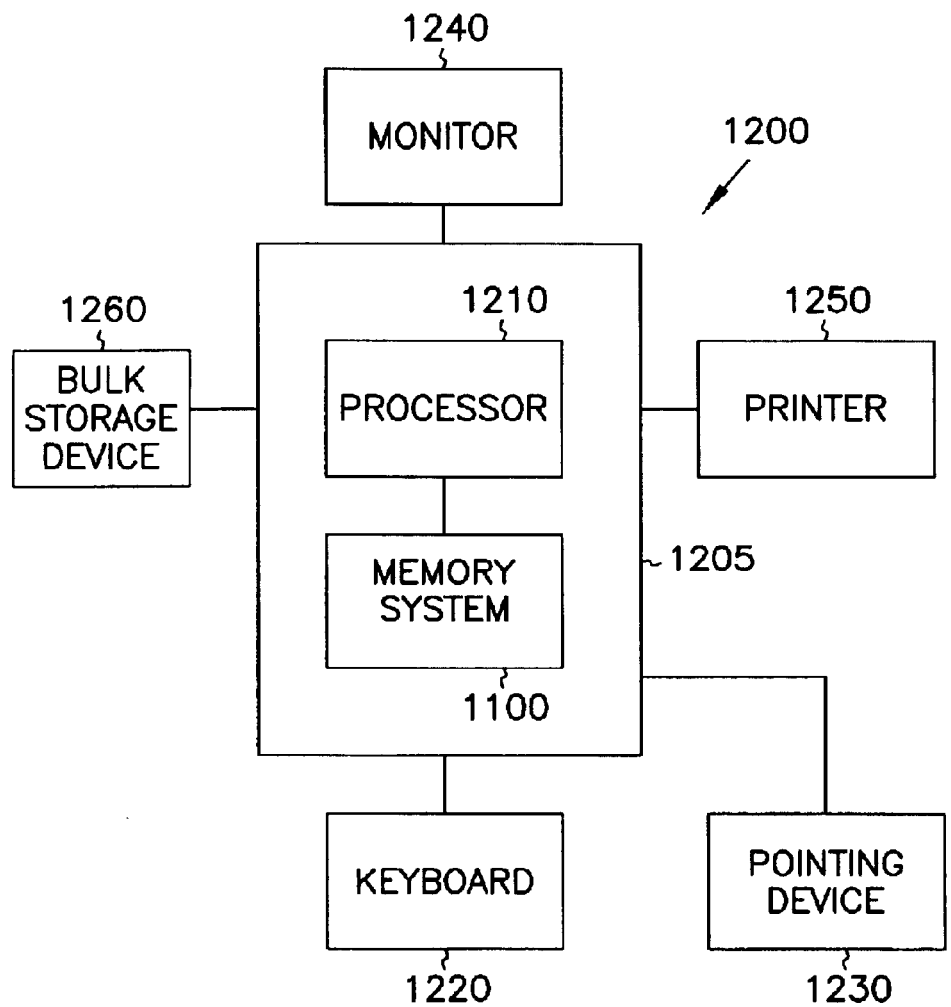
FIG. 9 is a block diagram of an exemplary computer system.

FIG. 9 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 9 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Methods of cleaning substrates are disclosed, particularly cleaning or removal of titanium-containing layers from a substrate surface where those titanium-containing layers were formed by chemical vapor deposition (CVD) techniques. The various embodiments use sulfuric acid solutions to remove titanium-containing layers without detrimentally removing surrounding materials, such as tungsten or silicon oxide materials. The sulfuric acid solutions consist essentially of aqueous or anhydrous sulfuric acid. Integrated circuit devices produced in accordance with embodiments of the invention have a reduced tendency for electrical shorts caused by residual titanium-containing layers on the surface of the substrate.

In devices where physical vapor deposition (PVD) techniques were used to form the titanium-containing layers, hydrofluoric acid (HF)-based solutions could be used to remove the titanium-containing layers without detrimentally removing a tungsten layer. However, due to the differences in the chemical characteristics of CVD layers, these prior cleaning solutions are generally ineffective at removing the titanium-containing layers. Ineffective removal of the titanium-containing layers increases the likelihood of metal shorts in resulting semiconductor devices.

Titanium-containing layers retained in the resultant device, where those titanium-containing layers were formed by CVD techniques, have improved surface characteristics over such titanium-containing layers exposed to traditional HF-based cleaning solutions. Such improved surface characteristics are the result of more uniform removal and reduced pitting of the surface.

Piranha baths, solutions containing $H_2SO_4$ and $H_2O_2$, are generally effective at removing titanium-containing layers deposited by CVD or PVD, but they also tend to remove tungsten at rates too high to permit removal of the titanium-containing layer without detrimentally removing tungsten. The embodiments of substrate cleaning methods provided herein facilitate selective and uniform removal of CVD titanium-containing layers while leaving the tungsten substantially un-attacked.

Although specific embodiments have been illustrated and described herein, it will be appreciated by those of ordinary skill in the art that any arrangement which is calculated to achieve the same purpose may be substituted for the specific embodiment shown. This application is intended to cover any adaptions or variations of the present invention. Therefore, it is manifestly intended that this invention be limited only by the claims and equivalents thereof.

What is claimed is:

1. A semiconductor die, comprising:
    an integrated circuit supported by a base layer and having a plurality of integrated circuit devices, wherein at least one of the plurality of integrated circuit devices has a semiconductor structure formed by a method comprising:
        forming an insulator layer on the base layer, wherein the insulator layer has a surface;
        patterning the insulator layer to define a hole, wherein the hole has sidewalls defined by the insulator layer and a bottom defined by an exposed portion of the base layer;
        forming at least one titanium-containing layer overlying the surface of the insulator layer and the sidewalls and bottom of the hole by chemical vapor deposition;
        forming a plug layer overlying the at least one titanium-containing layer and filling the hole;
        removing a portion of the plug layer overlying the surface of the insulator layer; and
        removing a portion of the at least one titanium-containing layer overlying the surface of the insulator layer subsequent to removing the portion of the plug layer by exposing the portion of the at least one titanium-containing layer to a sulfuric acid solution.

2. A semiconductor die, comprising:
    an array of memory cells, wherein at least one memory cell has a bit-line contact formed by a method comprising:
        forming an insulator layer on the base layer, wherein the insulator layer has a surface;
        patterning the insulator layer to define a hole, wherein the hole has sidewalls defined by the insulator layer and a bottom defined by an exposed portion of the base layer;
        forming at least one titanium-containing layer overlying the surface of the insulator layer and the sidewalls and bottom of the hole by chemical vapor deposition;
        forming a plug layer overlying the at least one titanium-containing layer and filling the hole;
            removing a portion of the plug layer overlying the surface of the insulator layer; and
            removing a portion of the at least one titanium-containing layer overlying the surface of the insulator layer subsequent to removing the portion of the plug layer by exposing the portion of the at least one titanium-containing layer to a sulfuric acid solution;
    a row access circuit coupled to the array of memory cells;
    a column access circuit coupled to the array of memory cells; and
    an address decoder circuit coupled to the row access circuit and the column access circuit.

3. A memory module, comprising:
    a support;
    a plurality of leads extending from the support;
    a command link coupled to at least one of the plurality of leads;
    a plurality of data links, wherein each data link is coupled to at least one of the plurality of leads; and
    at least one memory device contained on the support and coupled to the command link, wherein the at least one memory device comprises:
        an array of memory cells, wherein at least one memory cell has a bit-line contact formed by a method comprising:
            forming an insulator layer on a base layer, wherein the insulator layer has a surface;
            patterning the insulator layer to define a hole, wherein the hole has sidewalls defined by the insulator layer and a bottom defined by an exposed portion of the base layer;
            forming at least one titanium-containing layer overlying the surface of the insulator layer and the sidewalls and bottom of the hole by chemical vapor deposition;
            forming a plug layer overlying the at least one titanium-containing layer and filling the hole;
            removing a portion of the plug layer overlying the surface of the insulator layer; and
            removing a portion of the at least one titanium-containing layer overlying the surface of the insulator layer subsequent to removing the portion of the plug layer by exposing the portion of the at least one titanium-containing layer to a sulfuric acid solution;
        a row access circuit coupled to the array of memory cells;
        a column access circuit coupled to the array of memory cells; and
        an address decoder circuit coupled to the row access circuit and the column access circuit.

4. A memory system, comprising:
    a controller;
    a command link coupled to the controller;
    a data link coupled to the controller; and
    a memory device coupled to the command link and the data link, wherein the memory device comprises:
        an array of memory cells, wherein at least one memory cell has a bit-line contact formed by a method comprising:
            forming an insulator layer on a base layer, wherein the insulator layer has a surface;
            patterning the insulator layer to define a hole, wherein the hole has sidewalls defined by the insulator layer and a bottom defined by an exposed portion of the base layer;
            forming at least one titanium-containing layer overlying the surface of the insulator layer and the sidewalls and bottom of the hole by chemical vapor deposition;
            forming a plug layer overlying the at least one titanium-containing layer and filling the hole;
            removing a portion of the plug layer overlying the surface of the insulator layer; and
            removing a portion of the at least one titanium-containing layer overlying the surface of the insulator layer subsequent to removing the portion of the plug layer by exposing the portion of the at least one titanium-containing layer to a sulfuric acid solution;
a row access circuit coupled to the array of memory cells;
a column access circuit coupled to the array of memory cells; and
an address decoder circuit coupled to the row access circuit and the column access circuit.

5. An electronic system, comprising:
a processor; and
a circuit module having a plurality of leads coupled to the processor, and further having a semiconductor die coupled to the plurality of leads, wherein the semiconductor die comprises:
an integrated circuit supported by a base layer and having a plurality of integrated circuit devices, wherein at least one of the plurality of integrated circuit devices has a semiconductor structure formed by a method comprising:
forming an insulator layer on a base layer, wherein the insulator layer has a surface;
patterning the insulator layer to define a hole, wherein the hole has sidewalls defined by the insulator layer and a bottom defined by an exposed portion of the base layer;
forming at least one titanium-containing layer overlying the surface of the insulator layer and the sidewalls and bottom of the hole by chemical vapor deposition;
forming a plug layer overlying the at least one titanium-containing layer and filling the hole;
removing a portion of the plug layer overlying the surface of the insulator layer; and
removing a portion of the at least one titanium-containing layer overlying the surface of the insulator layer subsequent to removing the portion of the plug layer by exposing the portion of the at least one titanium-containing layer to a sulfuric acid solution.

6. A semiconductor die, comprising:
an integrated circuit supported by a base layer and having a plurality of integrated circuit devices, wherein at least one of the plurality of integrated circuit devices has a semiconductor structure formed by a method comprising:
forming a first layer overlying at least one titanium-containing layer, wherein the first layer is formed from a material suitable for use as a plug layer;
removing a portion of the first layer; and
removing a portion of the at least one titanium-containing layer by exposing the portion of the at least one titanium-containing layer to a solution that includes sulfuric acid ($H_2SO_4$).

7. The semiconductor die of claim 6, further comprising:
forming an insulator layer on the base layer, wherein the insulator layer has a surface;
patterning the insulator layer to define a hole, wherein the hole has sidewalls defined by the insulator layer and a bottom defined by an exposed portion of the base layer; and
forming the at least one titanium-containing layer overlying the surface of the insulator layer and the sidewalls and bottom of the hole by chemical vapor deposition.

8. The semiconductor die of claim 6, further comprising:
forming an insulator layer on the base layer, wherein the insulator layer has a surface;
patterning the insulator layer to define a hole, wherein the hole has sidewalls defined by the insulator layer and a bottom defined by an exposed portion of the base layer; and
wherein forming the at least one titanium-containing layer includes
forming a titanium layer overlying the surface of the insulator layer and the sidewalls and bottom of the hole by chemical vapor deposition, and
forming a titanium nitride layer overlying the titanium layer by chemical vapor deposition.

9. The semiconductor die of claim 8, wherein forming the first layer includes forming a tungsten layer overlying the titanium nitride layer and filling the hole.

10. The semiconductor die of claim 6, further comprising: selecting a material generally resistant to sulphuric acid for use as the first layer.

11. The semiconductor die of claim 6, further comprising:
forming an insulator layer on the base layer, wherein the insulator layer has a surface;
forming a dielectric anti-reflective coating overlying the insulator layer;
patterning the insulator layer and the dielectric anti-reflective coating to define a hole, wherein the hole has sidewalls defined by the insulator layer and a bottom defined by an exposed portion of the base layer; and
wherein forming the at least one titanium-containing layer includes
forming a titanium layer overlying the surface of the insulator layer and the sidewalls and bottom of the hole by chemical vapor deposition, and
forming a titanium nitride layer overlying the titanium layer by chemical vapor deposition.

12. The semiconductor die of claim 11, wherein forming the first layer includes forming a tungsten layer overlying the titanium nitride layer and filling the hole.

13. The semiconductor die of claim 11, wherein removing a portion of the at least one titanium-containing layer comprises:
removing a portion of the titanium and titanium nitride layers overlying the surface of the insulator layer subsequent to removing the portion of the first layer by immersing the portion of the titanium and titanium nitride layers in a sulfuric acid solution heated to approximately 100–140 degrees C.

14. A semiconductor die, comprising:
an array of memory cells, wherein at least one memory cell has a bit-line contact formed by a method comprising:
forming an insulator layer on a base layer, wherein the insulator layer has a surface;
patterning the insulator layer to define a hole, wherein the hole has sidewalls defined by the insulator layer and a bottom defined by an exposed portion of the base layer;
forming at least one titanium-containing layer overlying the surface of the insulator layer and the sidewalls and bottom of the hole by chemical vapor deposition;
forming a plug layer overlying the at least one titanium-containing layer and filling the hole;
removing a portion of the plug layer overlying the surface of the insulator layer; and removing a portion of the at least one titanium-containing layer overlying the surface of the insulator layer subsequent to removing the portion of the plug layer by exposing the portion of the at least one titanium-containing layer to a sulfuric acid solution;

a row access circuit coupled to the array of memory cells;

a column access circuit coupled to the array of memory cells; and an address decoder circuit coupled to the row access circuit and the column access circuit.

15. A semiconductor die, comprising:

a support;

a plurality of leads extending from the support;

a command link coupled to at least one of the plurality of leads;

a plurality of data links, wherein each data link is coupled to at least one of the plurality of leads; and at least one memory device contained on the support and coupled to the command link, wherein the at least one memory device comprises:

an array of memory cells, wherein at least one memory cell has a bit-line contact formed by a method comprising:

forming an insulator layer on a base layer, wherein the insulator layer has a surface;

patterning the insulator layer to define a hole, wherein the hole has sidewalls defined by the insulator layer and a bottom defined by an exposed portion of the base layer;

forming at least one titanium-containing layer overlying the surface of the insulator layer and the sidewalls and bottom of the hole by chemical vapor deposition;

forming a plug layer overlying the at least one titanium-containing layer and filling the hole;

removing a portion of the plug layer overlying the surface of the insulator layer; and removing a portion of the at least one titanium-containing layer overlying the surface of the insulator layer subsequent to removing the portion of the plug layer by exposing the portion of the at least one titanium-containing layer to a sulfuric acid solution;

a row access circuit coupled to the array of memory cells;

a column access circuit coupled to the array of memory cells; and an address decoder circuit coupled to the row access circuit and the column access circuit.

16. A semiconductor die, comprising:

a command link coupled to a controller;

a data link coupled to the controller; and a memory device coupled to the command link and the data link, wherein the memory device comprises:

an array of memory cells, wherein at least one memory cell has a bit-line contact formed by a method comprising:

forming an insulator layer on a base layer, wherein the insulator layer has a surface;

patterning the insulator layer to define a hole, wherein the hole has sidewalls defined by the insulator layer and a bottom defined by an exposed portion of the base layer;

forming at least one titanium-containing layer overlying the surface of the insulator layer and the sidewalls and bottom of the hole by chemical vapor deposition;

forming a plug layer overlying the at least one titanium-containing layer and filling the hole;

removing a portion of the plug layer overlying the surface of the insulator layer; and removing a portion of the at least one titanium-containing layer overlying the surface of the insulator layer subsequent to removing the portion of the plug layer by exposing the portion of the at least one titanium-containing layer to a sulfuric acid solution;

a row access circuit coupled to the array of memory cells;

a column access circuit coupled to the array of memory cells; and an address decoder circuit coupled to the row access circuit and the column access circuit.

* * * * *

UNITED STATES PATENT AND TRADEMARK OFFICE
CERTIFICATE OF CORRECTION

PATENT NO.   : 6,815,368 B2
DATED        : November 9, 2004
INVENTOR(S)  : Gary Chen It is certified that error appears in the above-identified patent and that said Letters Patent is hereby corrected as shown below:

<u>Column 9,</u>
Line 42, delete "semiconductor die" and insert -- memory device --, therefor.
Line 46, delete "the" and insert -- a --, therefor.

Signed and Sealed this

First Day of March, 2005

JON W. DUDAS
*Director of the United States Patent and Trademark Office*